United States Patent [19]
Webb

[11] Patent Number: 4,863,230
[45] Date of Patent: Sep. 5, 1989

[54] OPTICALLY CONTROLLED SELECTOR

[75] Inventor: Roderick P. Webb, Woodbridge, England

[73] Assignee: British Telecommunications Public Limited Company, Great Britain

[21] Appl. No.: 143,858

[22] PCT Filed: May 26, 1987

[86] PCT No.: PCT/GB87/00359

§ 371 Date: Jan. 19, 1988

§ 102(e) Date: Jan. 19, 1988

[87] PCT Pub. No.: WO87/07396

PCT Pub. Date: Dec. 3, 1987

[30] Foreign Application Priority Data

May 28, 1986 [GB] United Kingdom ............... 8612955

[51] Int. Cl.$^4$ .............................................. G02B 6/26
[52] U.S. Cl. ............................. 350/96.15; 350/96.16; 350/354
[58] Field of Search ............... 350/96.15, 96.16, 96.29, 350/354, 96.2

[56] References Cited

U.S. PATENT DOCUMENTS

| | | | |
|---|---|---|---|
| 4,199,698 | 4/1980 | Bethea et al. | 307/425 |
| 4,405,869 | 9/1983 | May | 307/405 |
| 4,558,923 | 12/1985 | Hoffmann et al. | 350/354 |
| 4,573,767 | 3/1986 | Jewell | 350/354 |
| 4,585,301 | 4/1986 | Bialkowski | 350/96.2 |

OTHER PUBLICATIONS

Jewell et al., "Use of a Single Nonlinear Fabry-Perot Etalon as Optical Logic Gates"; Appl. Phys. Letters, vol. 44, No. 2, Jan. 15, 1984, pp. 172–174.
Electronics Letters, vol. 21, No. 21, Oct. 10, 1985, (Stevenage, Herts., GB), H. J. Westlake et al: "Measurement of Optical Bistability in an InGaAsP Laser Amplifier at 1.5 $\mu$m", pp. 992–923.

Primary Examiner—John D. Lee
Assistant Examiner—John Ngo
Attorney, Agent, or Firm—Nixon & Vanderhye

[57] ABSTRACT

An optically controlled selector comprises an optical coupler having a first input for an optical input signal, a second input for an optical control signal and an output for a combined signal, and a resonant cavity downstream of the output of the coupler and arranged to receive the combined signal. The resonant cavity contains an optically non-linear material so that changes in the power of the optical control signal result in changes in the resonant frequency of the cavity. In use, the power of the optical control signal controls transmission or suppression of the optical input signal through the optical cavity. Such a selector acts as a simple switch or to select one from a number of optical signals of different wavelength. Preferably the optical material is active and the optical cavity formed by semiconductor laser amplifier.

9 Claims, 3 Drawing Sheets

OPTICALLY CONTROLLED SELECTOR

Optical transmission systems are now widespread and it is becoming increasingly desirable to provide devices which are directly controllable by optical signals to enable control logic for a telecommunications system to be carried out entirely optically.

In this specification, the term optical is intended to refer to the visible region of the electromagnetic spectrum together with those parts of the infrared and ultraviolet regions at each end of the visible region which are capable of being transmitted by dielectric optical waveguides such as optical fibres.

According to this invention an optically controlled selector comprises an optical coupler having a first input for an optical input signal, a second input for an optical control signal and an output 4 for a combined signal, and a resonant cavity downstream of the output of the coupler and arranged to receive the combined signal, the resonant cavity containing an optically non-linear material so that changes in the power of the optical control signal result in changes in the resonant frequency of the cavity. In use, the power of the optical control signal controls the transmission or suppression of the optical input signal in the optical cavity.

Such a selector can act as a simple switch and, in this case, the input signal is usually monochromatic. When the control signal tunes the optical cavity to resonate at the frequency of the input optical signal the optical cavity transmits the input optical signal and so acts as a switch which is ON but when the optical control signal tunes the resonant frequency of the cavity to one other than that of the input signal, the input signal is suppressed by passage through the optical cavity so that the switch is OFF.

Alternatively the selector may be used to select one of a number of input signals having different frequencies. An example of this is where the input signal is a frequency or wavelength division multiplexed signal containing two or more separate signals each having a different wavelength. In this case, the control signal is used to set the resonance frequency of the optical cavity to match a particular one of the number of input signals so that this particular one signal is transmitted through the optical cavity whereas the remainder of the optical signals are suppressed. In this way the selector in accordance with the present invention forms the basis of an optically controlled de-multiplexer for a frequency or wavelength division multiplexed optical signal.

The cavity is preferably a Fabry-Perot cavity resonator and preferably it is completely filled by the optically non-linear material. It is possible to use passive non-linear materials such as zinc selenide or gallium arsenide. However, it is very much preferred that the optical material in the cavity is an active optical material so that the optical cavity acts as a resonance amplifier and provides a strong positive gain for optical signals whose frequency corresponds to the resonant frequency of the cavity. The use of an active non-linear optical material increases the selectivity of the selector and improves the ratio of discrimination between those signals transmitted and those suppressed in the optical cavity. When used with communication systems the optical cavity is typically formed by a semiconductor laser amplifier. Such an amplifier may be of the Fabry-Perot type or of the distributed feedback type.

The bias current applied to the laser amplifier, in use, biases the amplifier to a level below its lasing threshold. When both the optical input signal or signals and the optical control signal is fed into the amplifier this increases the power of the light passing through the amplifier and causes a change in its refractive index so tuning the amplifier to a different resonant frequency. When the laser amplifier is tuned by the optical control signal to resonate at the same frequency as that of the one or the selected one of the input signals that input signal is amplified and any others are suppressed.

The selector may also include biasing means such as a constant current source for supplying a bias current to the laser amplifier to bias it to a level just below its lasing threshold. In this case the biasing means preferably include control means which maintain the bias at a constant level.

Filtering means such as a monochromator are located downstream of the optical cavity to separate the control signal from the, or the selected one of the, input signals but filtering means are unnecessary when subsequent equipment downstream from the optical cavity which receives the output signals is only responsive to light of the or the selected one input signal frequency or, alternatively, is unaffected by the control signal. The filtering means also removes any spontaneous emission generated when the optical cavity is formed by a laser.

A selector in accordance with this invention and an experiment to demonstrate its operation will now be described with reference to the accompanying drawings in which.

Figure 1:
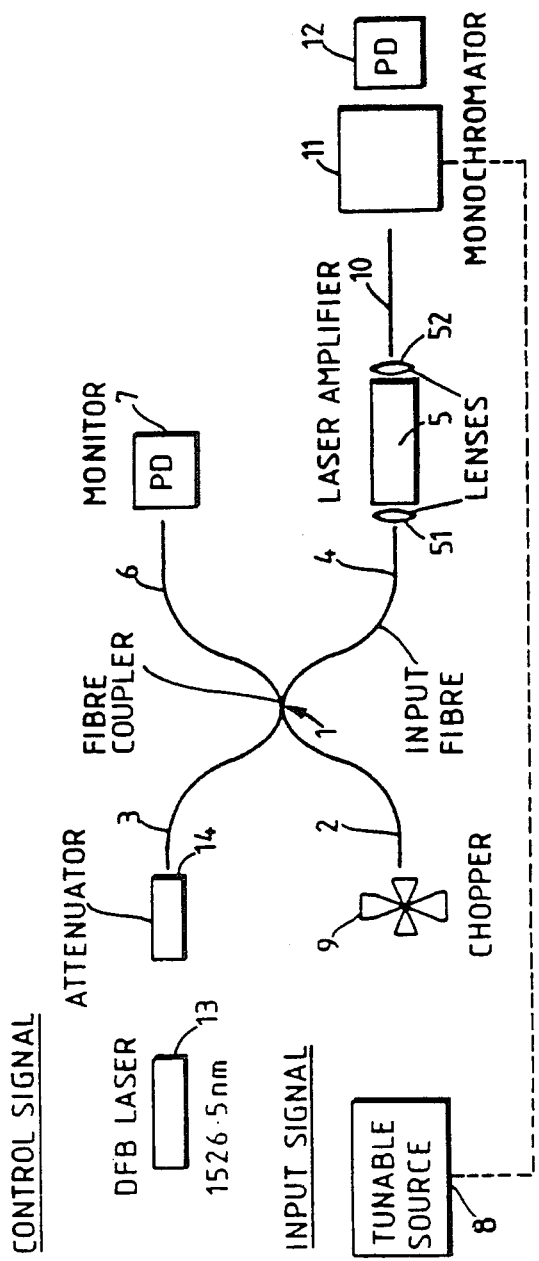
FIG. 1 is a diagram of the selector and the experimental arrangement.

A selector in accordance with this invention comprises an optical fibre coupler 1 having a first input 2 for an input optical signal, a second input 3 for a control signal and an output for a combined optical signal, and a laser amplifier 5. The laser amplifier is of the Fabry-Perot type and configured as a double channel planer buried hetrostructure laser such as that described in an article in Electronics Letters May 23, 1985, Vol. 21, No. 11, pages 493–494, entitled "High Performance DC-PBH Lasers at 1.52 micrometres by a Hybrid MOV-PE/LPE Process", by Nelson A W, Wong S, Regnault J C, Hobbs R E, Murrel D L, and Walling R H. The facet reflectivities of the laser are reduced by the application of anti-reflection coating until they have a reflectivity of between 3 and 4%. The laser is biased at 93% of its threshold current. The fibre coupler 1 is a directional coupler and the output fibre 4 terminates in a taper and is coupled via lens 51 to the laser amplifier 5.

For the purpose of an experiment to demonstrate the operation of the selector a second output 6 is taken out of the coupler 1 to enable an optical input signal applied to the second input 2 to be monitored. Light emitted from the second output 6 is received on a photodiode 7. An optical signal input is generated by a tunable source 8 comprising an external-cavity laser such as that described in Electronics Letters Feb. 3, 1983, Vol. 19, No. 3, pages 110–112, in an article entitled "10 kHz Linewidth 1.5 micrometre InGaAsP external Cavity Laser with 55 nm Tuning Range", by Wyatt R, and Devlin W J. The external cavity of this laser is defined by a rotatable diffraction grating and the laser is tuned by rotating its grating with a stepping motor. The tunable source 8 also includes an optical feedback loop which controls the bias current to keep the output of the laser constant at 3 microwatts. The output is fed via a chopper wheel 9 through the first input 2 of the coupler 1. An output 10 from the amplifier 5 via lens 52 is fed to a monochromator 11 which is coupled to the tunable source 8 so that it always transmits light of the same wavelength as that emitted by the tunable source 8. A second photodiode 12 is located downstream from the monochromator 11 to monitor light that passes through the monochromator 11.

A control signal is provided at the second input 3 of the coupler 1 by a distributed feedback laser 13 operating at 1526.5 nm. The light output from this laser is coupled via attenuator 14 to the second input 3 of the coupler 1.

Figure 2:
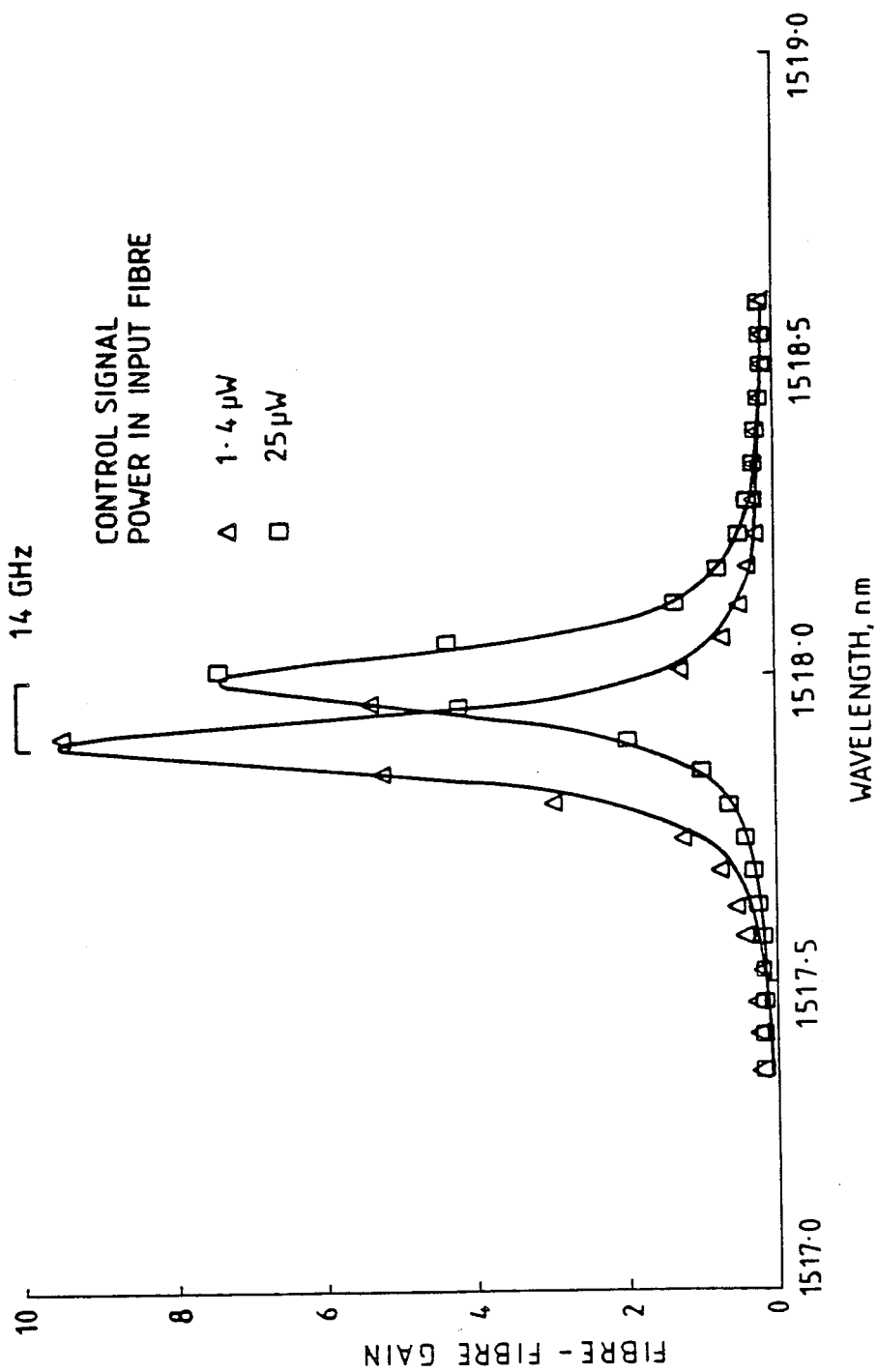
FIG. 2 is a graph of the gain against wavelength characteristic of the selector with light of two different powers; and, FIG. 3 is a graph showing the change of amplifier resonance wavelength against control signal power for input signals in three different wavelength bands.

To demonstrate the effectiveness of the selector its gain was measured against wavelength by tuning the tunable source 8 and the monochromator 11 together and recording the chopped signals monitored by the photodiodes 7 and 12. Such a scan was repeated with different levels of control signal and about different center wavelengths. Two of the scans are shown in FIG. 2. From the series of such scans the change of resonant wavelength against control signal power was plotted as shown in FIG. 3.

The amplifier acted as an active filter with a half-power bandwidth of 0.11 nm (14 GHz) and peak fibre-to-fibre gain of 10 dB. The bandwidth depends upon the bias current and the facet reflectivities and may be increased or reduced as required. Increasing the control signal power increases the rate of stimulated emission and thus reduces the carrier density and raises the refractive index in the amplifier. An increase from 1.4 to 25 microwatts tuned the amplifier resonance by 0.11 nm.

Figure 3:
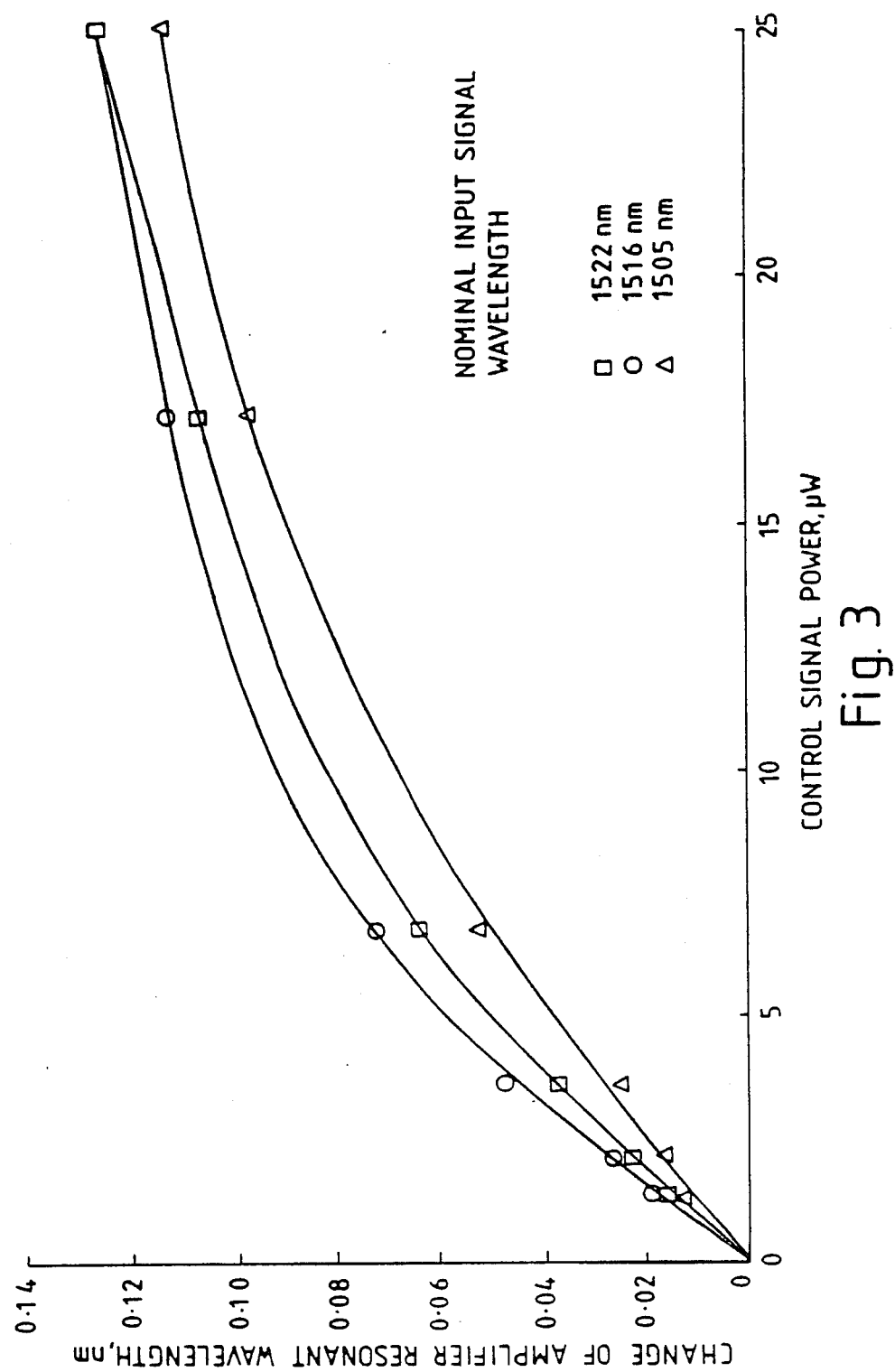

FIG. 3 illustrates a decreasing tuning effect as the power of the control signal is increased. This is because an amplifier resonance is moving away from a fixed control signal wavelength, thus reducing the amplification and effect of the control signal. A larger tuning range is obtainable with a more powerful control signal at a slightly longer wavelength.

I claim:

1. An optically controlled selector comprising:
   an optical coupler having a first input for an optical input signal, a second input for an optical control signal and an output for a combined signal, and
   an optical amplifier downstream of the output of the coupler and arranged to receive the combined signal,
   said optical amplifier including a resonant cavity containing an optically non-linear material of the type such that changes in the power of the optical control signal result in changes in the resonant frequency of the cavity, in use, the power of the optical control signal controlling the transmission or suppression of the optical input signal in the optical cavity.

2. A selector according to claim 1 in which the cavity is a Fabry-Perot cavity resonator which is completely filled by the optically non-liner material.

3. A selector according to claim 1 in which the optical cavity is formed by a semi-conductor laser amplifier.

4. A selector according to claim 3 in which the amplifier is of the Fabry-Perot type or of the distributed feedback type.

5. A selector according to claim 1 in which filtering means are located downstream of the optical cavity to separate the control signal from the, or the selected one of the, input signals.

6. A selector according to claim 5 in which the filtering means are formed by a monochromator.

7. An optical communication system including a selector in accordance with claim 1, 5 or 6.

8. An optically-controlled optical switch comprising:
   an optical signal input port for accepting optical input signals of frequency $f_1$;
   an optical control signal source of frequency $f_2$ which is different from $f_1$;
   an optical signal coupler disposed to combine said optical signals of frequency $f_1$ and $f_2$ into a common optical signal path;
   an optical signal amplifier disposed in said common optical signal path and including a resonant cavity containing an optically non-linear material of the type such that selective changes in power of the optical control signal selectively change the resonant frequency of the cavity and thereby selectively control passage or non-passage of the input optical signal therethrough.

9. A method for selectively passing or blocking an input optical signal $I_1$ of frequency $f_1$, said method comprising the steps of:
   supplying said optical signal $I_1$ of frequency $f_1$ to an optical resonant cavity having non-linear optical properties which cause the cavity to have a resonant frequency response which changes as a function of input optical signal power; and
   supplying a control optical signal $I_2$ to said resonant cavity and selectively controlling the magnitude of said control signal so as to change the resonant frequency response between (a) a first state in which said input signal frequency $f_1$ falls within the resonant frequency response thereby passing the input optical signal to an output port of the cavity and (b) a second state in which said input signal frequency $f_1$ falls outside the resonant frequency response thereby blocking the input optical signal from said output port.

* * * * *